(12) United States Patent
Sun

(10) Patent No.: US 11,050,267 B2
(45) Date of Patent: Jun. 29, 2021

(54) POWER SUPPLY SYSTEM

(71) Applicant: TOYOTA JIDOSHA KABUSHIKI KAISHA, Toyota (JP)

(72) Inventor: Linyu Sun, Anjo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 29 days.

(21) Appl. No.: 16/058,003

(22) Filed: Aug. 8, 2018

(65) Prior Publication Data

US 2019/0067960 A1 Feb. 28, 2019

(30) Foreign Application Priority Data

Aug. 22, 2017 (JP) .............................. JP2017-159649

(51) Int. Cl.
*H02J 7/00* (2006.01)
*G01R 31/3842* (2019.01)
*G01R 31/389* (2019.01)

(52) U.S. Cl.
CPC ............ *H02J 7/0021* (2013.01); *H02J 7/007* (2013.01); *H02J 7/0013* (2013.01); *G01R 31/389* (2019.01); *G01R 31/3842* (2019.01); *H02J 7/00302* (2020.01)

(58) Field of Classification Search
CPC ............. H02J 7/0021; H02J 7/007; H02J 7/00
USPC ......................................................... 320/162
See application file for complete search history.

(56) References Cited

U.S. PATENT DOCUMENTS

| 2002/0105305 | A1 | 8/2002 | Yagi et al. | |
| 2010/0320969 | A1* | 12/2010 | Sakakibara | H01M 10/425 320/118 |
| 2012/0091966 | A1 | 4/2012 | Mori | |
| 2012/0319653 | A1* | 12/2012 | Kumar | H02J 7/0021 320/118 |
| 2013/0193768 | A1* | 8/2013 | Iwasaki | H02J 7/35 307/85 |
| 2014/0159666 | A1 | 6/2014 | Takeyama | |
| 2014/0354213 | A1* | 12/2014 | Rivera-Poventud | H02J 7/0016 320/107 |

(Continued)

FOREIGN PATENT DOCUMENTS

| JP | 2002-238180 A | 8/2002 |
| JP | 2013-038831 A | 2/2013 |

(Continued)

*Primary Examiner* — Richard Isla
*Assistant Examiner* — Dung V Bui
(74) *Attorney, Agent, or Firm* — Oliff PLC

(57) ABSTRACT

A power supply system includes a plurality of batteries, a plurality of battery control devices, and a charging device configured to receive charging information of the batteries transmitted from the battery control devices. The batteries are connected in parallel. Each of the battery control devices is configured to set any one of the batteries as a target battery, and control a charging state of the target battery. Each of the battery control devices is configured to transmit and receive an internal resistance value obtained from the target battery to and from other battery control devices, and generate and transmit charging information of the target battery based on the internal resistance values of the batteries. The charging device is configured to execute charging processing of the batteries based on the charging information of the batteries.

2 Claims, 4 Drawing Sheets

(56) References Cited

U.S. PATENT DOCUMENTS

| | | | |
|---|---|---|---|
| 2015/0171642 A1* | 6/2015 | Kato | H01M 10/482 |
| | | | 320/107 |
| 2015/0295430 A1* | 10/2015 | Wright | B60L 58/22 |
| | | | 320/162 |
| 2015/0301115 A1* | 10/2015 | Ohkawa | H02J 7/0077 |
| | | | 324/429 |
| 2015/0357852 A1* | 12/2015 | Nakao | G01R 31/3842 |
| | | | 320/162 |
| 2015/0362543 A1* | 12/2015 | Gale | G01R 31/006 |
| | | | 324/503 |
| 2016/0049813 A1* | 2/2016 | Takizawa | H02J 7/0021 |
| | | | 320/112 |
| 2016/0195590 A1* | 7/2016 | Kosugi | G01R 31/3842 |
| | | | 340/636.19 |
| 2016/0336623 A1* | 11/2016 | Nayar | H02J 7/0068 |
| 2016/0347163 A1* | 12/2016 | Dorsett | B60L 50/16 |
| 2017/0005371 A1* | 1/2017 | Chidester | B60L 3/0046 |
| 2017/0025869 A1* | 1/2017 | Lundholm | H02J 7/007192 |
| 2017/0108552 A1* | 4/2017 | Roumi | G01R 31/392 |
| 2017/0139014 A1* | 5/2017 | Yamamoto | G01R 31/382 |

FOREIGN PATENT DOCUMENTS

| | | |
|---|---|---|
| JP | 2015-231301 A | 12/2015 |
| JP | 2018-082577 A | 5/2018 |

\* cited by examiner

POWER SUPPLY SYSTEM

INCORPORATION BY REFERENCE

The disclosure of Japanese Patent Application No. 2017-159649 filed on Aug. 22, 2017 including the specification, drawings and abstract is incorporated herein by reference in its entirety.

BACKGROUND

1. Technical Field

The present disclosure relates to a power supply system using a plurality of batteries.

2. Description of Related Art

Japanese Unexamined Patent Application Publication No. 2015-231301 (JP 2015-231301 A) discloses a power supply system that controls charging and discharging by a battery in a battery pack in which a plurality of batteries is connected in series or in parallel.

SUMMARY

When a battery pack in which a plurality of batteries is connected in parallel is charged using a single charger, a charging current that is shunted from the charger to each of the batteries is determined by an internal resistance of the battery. Therefore, when batteries have internal resistances different from each other, a difference in charging currents occurs during charging. For this reason, a change in rising voltage occurs, and the voltage rise after a start of charging causes the voltage to reach a voltage upper limit, which may lead to immediate completion of charging. When a voltage drop occurs after the end of charging and charging is started again, there is a possibility that the start and end of the charging are repeated frequently.

The present disclosure provides a power supply system capable of further suppressing a frequent repetition of the start and end of charging for a configuration in which a battery pack in which a plurality of batteries is connected in parallel is charged using a single charger.

An aspect of the present disclosure relates to a power supply system including a plurality of batteries, a plurality of battery control devices, and a charging device configured to receive charging information about the batteries transmitted from the battery control devices. The batteries are connected in parallel. Each of the battery control devices is configured to set any one of the batteries to be a target battery, and control a charging state of the target battery. Each of the battery control devices is configured to transmit and receive an internal resistance value obtained from the target battery to and from other battery control devices. Each of the battery control devices is configured to generate and transmit charging information of the target battery based on the internal resistance values of the batteries. The charging device is configured to execute charging processing of the batteries based on the charging information of the batteries.

In the power supply system according to the aspect of the present disclosure, the battery control device that controls the charging state in each of the batteries is provided, and information about the internal resistance value of each battery is transmitted and received between the battery control devices. The battery control device transmits the charging information of the target battery generated based on the internal resistance values of the other batteries received from the other battery control devices to the charging device. The charging device appropriately executes the charging processing of the batteries based on the charging information received from the battery control devices.

With the above-described control, the charging device can receive the charging state of the batteries, and thus even after the start of the charging, it is possible to grasp the individual situation such as the immediate completion of charging of the specific battery. Therefore, since the charging device can determine the timing of the start of charging, it is possible to further suppress frequent repetition of the charging of the batteries.

In the power supply system according to the aspect of the present disclosure, each of the battery control devices may be configured to determine whether or not to permit charging of the target battery. Each of the battery control devices may be configured to transmit a result of the determination as the charging information.

With the above-described control, the charging device can easily determine whether or not to start charging the batteries based on the charging information transmitted from the battery control devices.

In the power supply system according to the aspect of the present disclosure, each of the battery control devices may be configured to calculate the maximum voltage value of the target battery that rises in a predetermined time after a start of charging based on the internal resistance values of the batteries and the maximum total charge current value transmitted from the charging device during the charging. Each of the battery control devices may be configured to transmit a charging permission of the target battery to the charging device when a difference voltage value between the maximum voltage value and a predetermined full charge voltage value exceeds a predetermined value.

With the above-described control, only when each battery control device can determine that charging of the target battery will not be immediately completed within the predetermined time based on all the internal resistance values and the maximum total charge current value during the charging, the charging permission can be transmitted to the charging device. Therefore, when the charging device executes the charging processing of the batteries based on the charging permission, it is possible to further suppress frequent repetition of the charging of the batteries.

In the power supply system according to the aspect of the present disclosure, the charging device may be configured to start charging the batteries when the charging permission is transmitted from all the battery control devices. As described above, the charging device can easily grasp the timing of starting charging the batteries simply by determining that the charging permission has been received from all the battery control devices.

With the power supply system according to the aspect of the present disclosure, for the configuration in which a battery pack in which the batteries are connected in parallel is charged using a single charger, it is possible to further suppress the frequent repetition of the start and end of the charging.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Outline

An embodiment of the present disclosure is a power supply system in which a plurality of batteries is connected in parallel. In the power supply system according to the embodiment of the present disclosure, a control device provided in each battery transmits and receives information about an internal resistance value of each battery. The power supply system predicts a rising voltage value after a start of charging based on the internal resistance value and a current value flowing in the battery during charging and controls a timing of the start of the charging so that the maximum voltage value of each battery does not immediately exceed a predetermined full charge voltage value. As described above, it is possible to further suppress frequent repetition of the start and end of charging.

Configuration of Power Supply System

Figure 1:
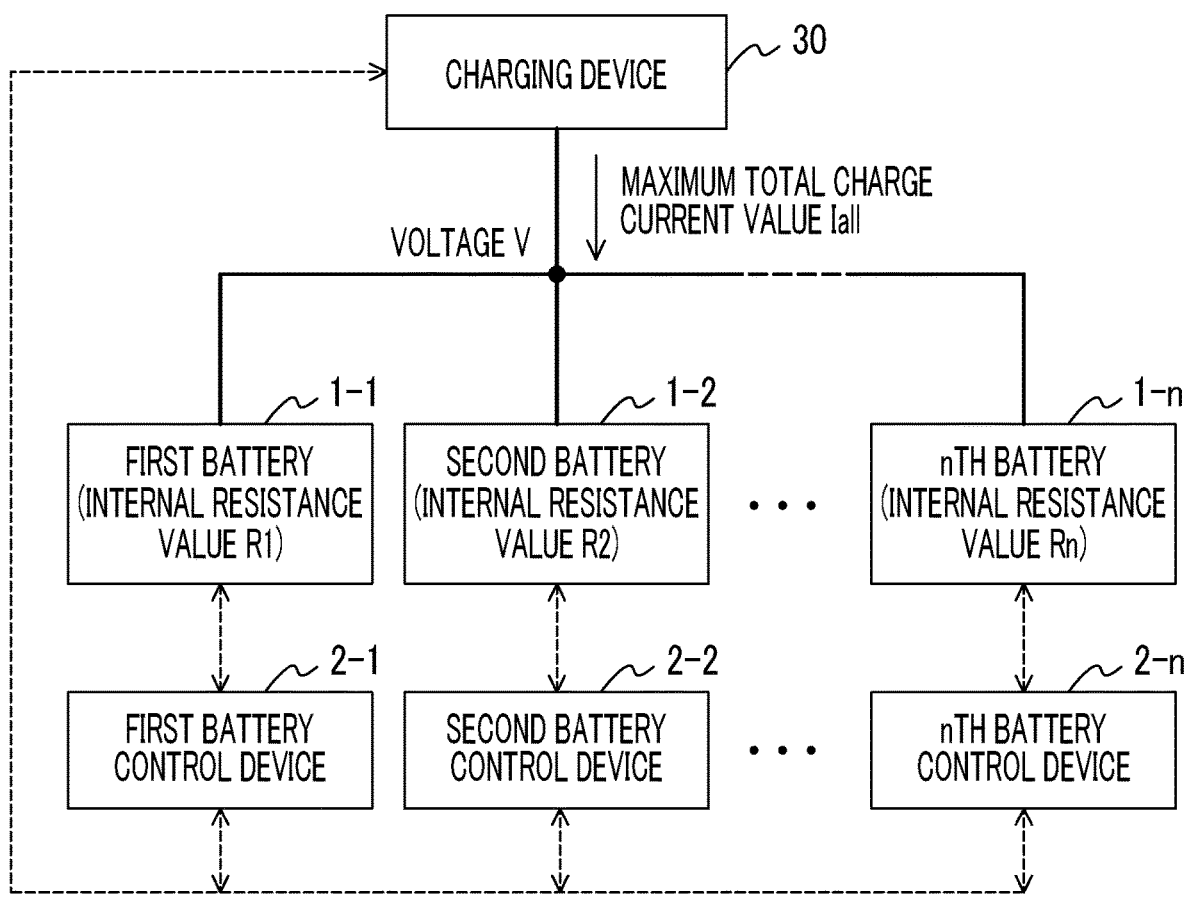
FIG. 1 is a diagram illustrating a schematic configuration of a power supply system according to an embodiment of the present disclosure.

FIG. 1 is a diagram illustrating a schematic configuration of a power supply system 1 according to an embodiment of the present disclosure. A power supply system 1 illustrated in FIG. 1 includes a plurality of batteries 1-1 to 1-$n$ (a first battery 1-1, a second battery 1-2, . . . , and an nth battery 1-$n$), a plurality of battery control devices 2-1 to 2-$n$ (a first battery control device 2-1, a second battery control device 2-2, . . . , and an nth battery control device 2-$n$), and a charging device 30. n is an integer of 2 or more.

The batteries 1-1 to 1-$n$ are power storage elements configured to allow electrical power to be charged and discharged, such as a lead storage battery or a lithium ion battery. The batteries 1-1 to 1-$n$ are connected in parallel and are connected to the charging device 30 in a chargeable manner. Each of batteries 1-1 to 1-$n$ has an internal resistance.

In the example of FIG. 1, the first battery 1-1 has an internal resistance of a resistance value R1 (hereinafter referred to as "internal resistance value R1"). The second battery 1-2 has an internal resistance of a resistance value R2 (hereinafter referred to as "internal resistance value R2"). The nth battery 1-$n$ has an internal resistance of a resistance value Rn (hereinafter referred to as "internal resistance value Rn").

Each of the battery control devices 2-1 to 2-$n$ is configured to set any one of the batteries 1-1 to 1-$n$ to be a target battery and control the charging state of the target battery. Typically, the battery control devices 2-1 to 2-$n$ are electronic control units (ECUs) including a central processing unit (CPU), a memory, an input and output interface, and the like.

In the example of FIG. 1, the first battery control device 2-1 can set the first battery 1-1 to be the target battery and control the charging state of the first battery 1-1. The second battery control device 2-2 can set the second battery 1-2 to be the target battery and control the charging state of the second battery 1-2. The nth battery control device 2-$n$ can set the nth battery 1-$n$ to be the target battery and control the charging state of the nth battery 1-$n$.

The battery control devices 2-1 to 2-$n$ are communicably connected to each other, each of which acquires the internal resistance values of the target battery, and transmits and receives the internal resistance value to and from other battery control devices. The transmission of the internal resistance value may be performed periodically, or may be performed when there is a change from the previously transmitted value.

In the example of FIG. 1, the first battery control device 2-1 acquires the internal resistance value R1 of the first battery 1-1 and transmits the internal resistance value R1 to the second battery control device 2-2 and the nth battery control device 2-$n$. The first battery control device 2-1 receives the internal resistance value R2 from the second battery control device 2-2 and the internal resistance value Rn from the nth battery control device 2-$n$. The second battery control device 2-2 acquires the internal resistance value R2 of the second battery 1-2 and transmits the internal resistance value R2 to the first battery control device 2-1 and the nth battery control device 2-$n$. The second battery control device 2-2 receives the internal resistance value R1 from the first battery control device 2-1 and the internal resistance value Rn from the nth battery control device 2-$n$. The nth battery control device 2-$n$ acquires the internal resistance value Rn of the nth battery 1-$n$ and transmits the internal resistance value Rn to the first battery control device 2-1 and the second battery control device 2-2. The nth battery control device 2-$n$ receives the internal resistance value R1 from the first battery control device 2-1 and the internal resistance value R2 from the second battery control device 2-2.

The battery control devices 2-1 to 2-$n$ are communicably connected to the charging device 30, and each of the battery control devices generates the target battery's predetermined charging information based on the internal resistance values R1 to Rn of the batteries 1-1 to 1-$n$ obtained by transmission and reception to and from other battery control devices, and transmits the generated charging information to the charging device 30. The target battery's charging information will be described later.

Figure 4:
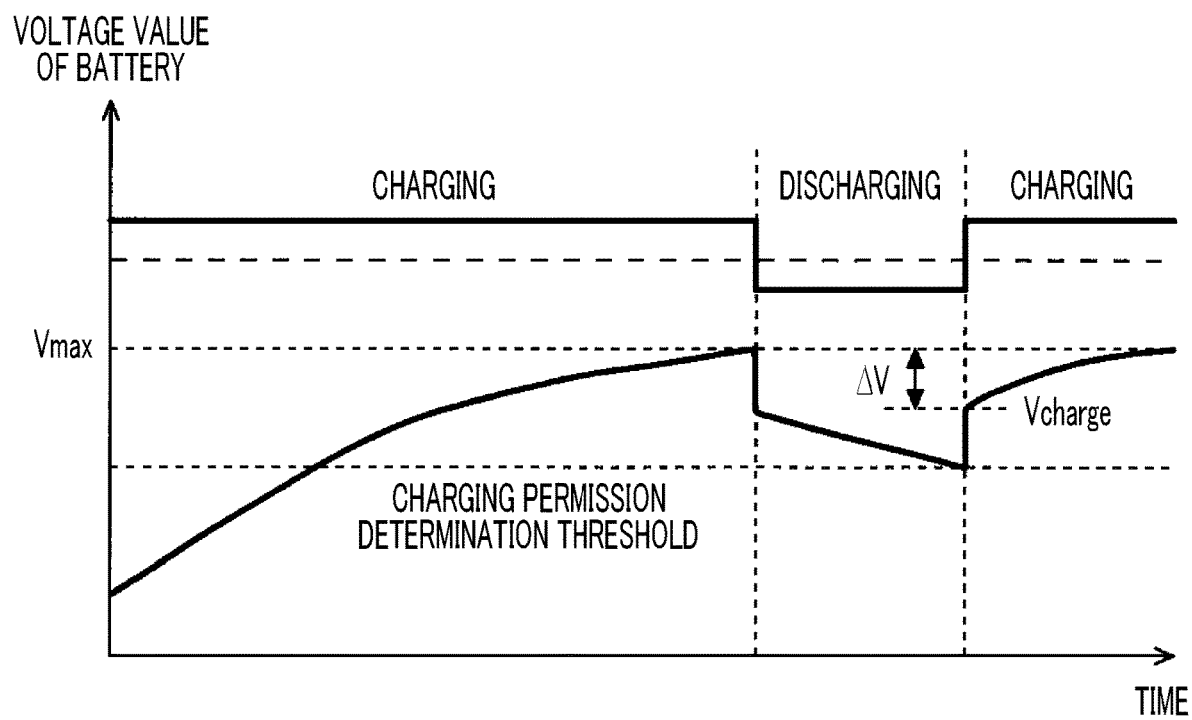
FIG. 4 is a graph illustrating an example of a charging control executed by the charging device.

The charging device 30 is connected to the batteries 1-1 to 1-$n$ with a power line (solid line in FIG. 1) and to the battery control devices 2-1 to 2-$n$ with a communication line (broken line in FIG. 1). The charging device 30 is configured to execute charging processing of the batteries 1-1 to 1-$n$ based on charging information of batteries 1-1 to 1-$n$ transmitted from the battery control devices 2-1 to 2-$n$. FIG. 4 is a graph illustrating an example of the charging control executed by a charging device 30. The control executed by the charging device 30 will be described later.

Control Executed by Power Supply System

Figure 2:
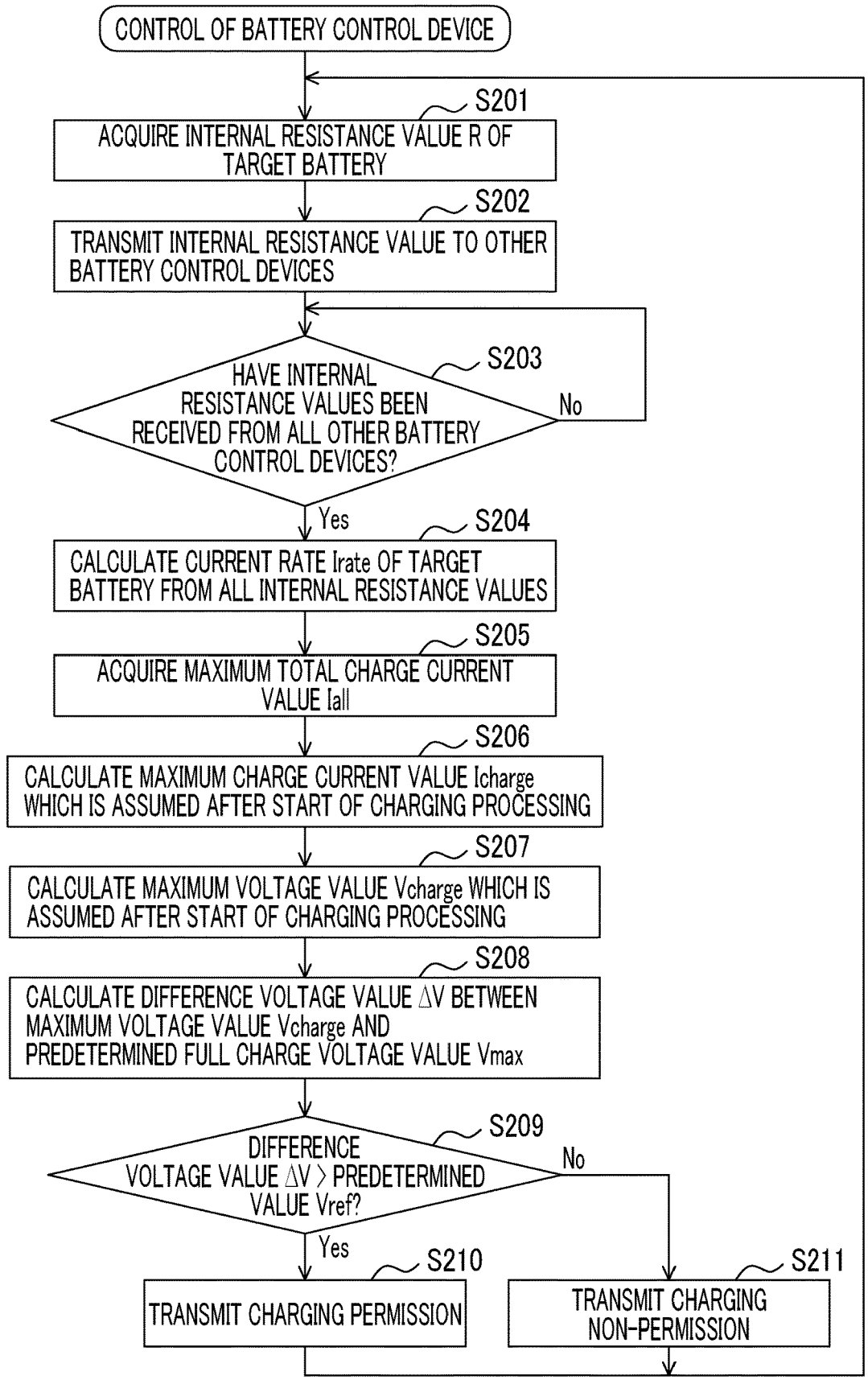
FIG. 2 is a flowchart for describing a processing procedure of a control executed by a battery control device.
Figure 3:
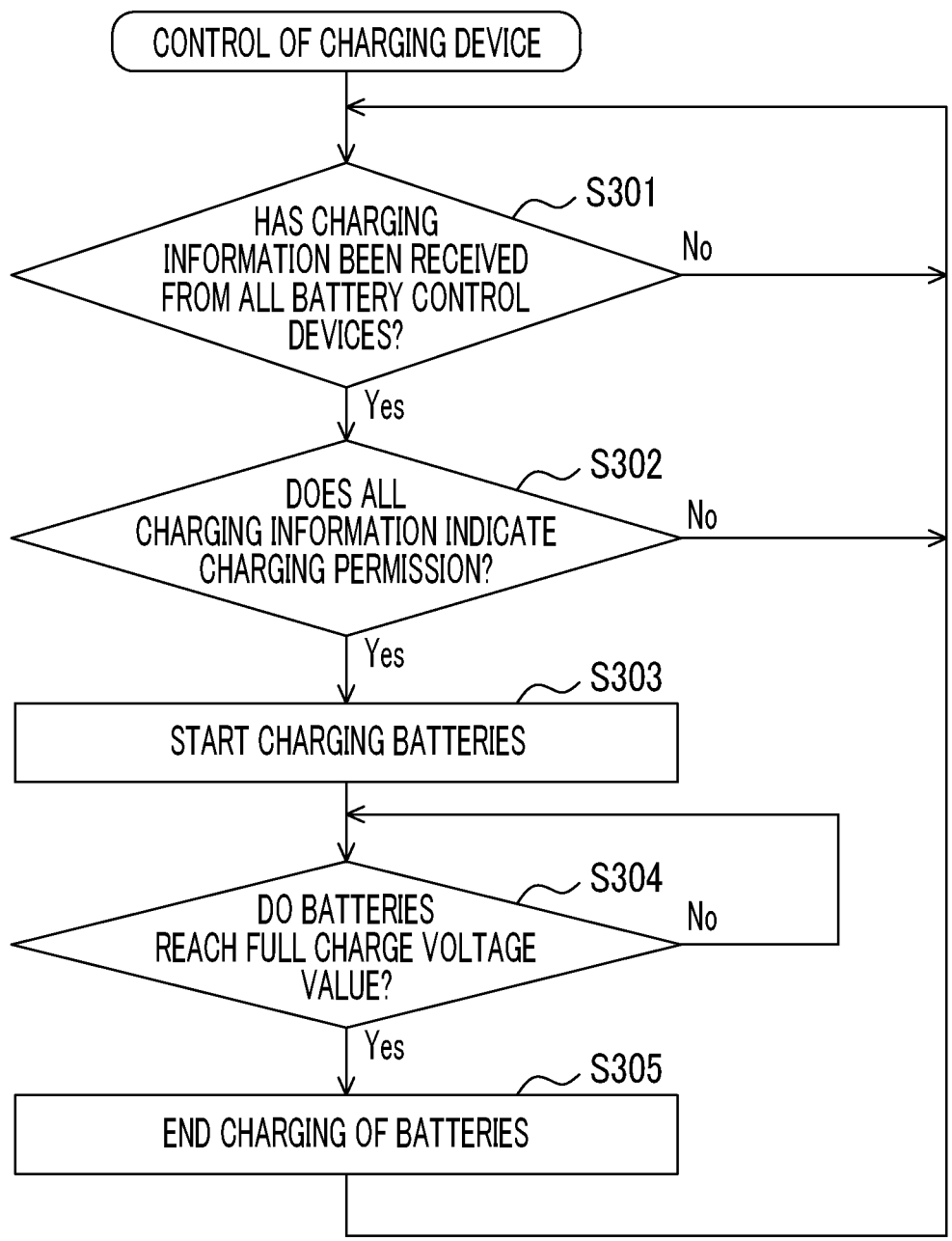
FIG. 3 is a flowchart for describing a processing procedure of a control executed by the charging device.

A control method executed by the power supply system 1 according to an embodiment of the present disclosure will be described with reference to FIGS. 2 and 3. FIG. 2 is a flowchart for describing a processing procedure of a control executed by each of the battery control devices 2-1 to 2-$n$ in the power supply system 1. FIG. 3 is a flowchart for describing a processing procedure of a control executed by the charging device 30 in the power supply system 1.

Control of Battery Control Device

FIG. 2

The control of the battery control device is a control executed by each of the battery control devices 2-1 to 2-$n$. Hereinafter, description will be given focusing on processing executed by the battery control device 2-1. The processing of FIG. 2 is executed when the voltage value of the target battery 1-1 drops to the charging permission determination threshold (see FIG. 4).

Step S201: The internal resistance value of the target battery 1-1 is acquired. The internal resistance value can be calculated from the current value flowing through the target battery 1-1 during charging or discharging and the voltage value of the target battery 1-1. There is a certain error between the calculated actual internal resistance value and the true value. Therefore, the maximum internal resistance value (R1max), which is the maximum internal resistance value with the error taken into consideration, is set to be the internal resistance value R1 to be transmitted to the other battery control devices 2-2 to 2-$n$, and the minimum internal resistance value (R1min), which is the minimum internal resistance value with the error taken into consideration, is set for calculation by the battery control device 2-1 of the target battery 1-1. This is because, when the internal resistance values of the other batteries are estimated to be relatively large and the internal resistance value of the battery of the target battery is estimated to be relatively small, for the current flowing in the battery of the target battery being expected to be relatively large, the voltage rise value of the battery of the target battery is estimated to be relatively large. That is, charging permission can be determined in consideration of a margin. If the internal resistance value (R1max, R1min) of the target battery 1-1 is acquired, the processing proceeds to step S202.

Step S202: The acquired internal resistance value R1 of the target battery 1-1 is transmitted to the other battery control devices 2-2 to 2-$n$. If the internal resistance value R1 of the target battery 1-1 is transmitted, the processing proceeds to step S203.

Step S203: Determination is made whether or not internal resistance values R2 to Rn of the batteries 1-2 to 1-$n$ have been received from all the other battery control devices 2-2 to 2-$n$. When all the internal resistance values R2 to Rn of the batteries 1-2 to 1-$n$ have been received (Yes in S203), the processing proceeds to step S204. On the other hand, when all the internal resistance values R2 to Rn of the batteries 1-2 to 1-$n$ have not been received (No in S203), the processing waits until all the internal resistance values are received.

Step S204: From the internal resistance values R1 to Rn of all the batteries 1-1 to 1-$n$, a current rate Irate which indicates a ratio of a current value Iself which is the value of the current flowing through the target battery 1-1 to a total current value Iother which is the total value of the current flowing through the other batteries 1-2 to 1-$n$ is calculated. The current rate Irate can be calculated by the following equation [1] using the internal resistance value Rself (=R1min) of the target battery 1-1 and the combined resistance value Rother (=1/R2+ . . . +1/Rn) of the other batteries 1-2 to 1-$n$. If the current rate Irate is calculated, the processing proceeds to step S205.

$$Irate=Iself/Iother=Rother/Rself \qquad [1]$$

Step S205: The maximum total charge current value Iall transmitted from the charging device 30 during charging is acquired. The maximum total charge current value Iall depends on the capability of the charging device 30 and is a predetermined value. When the charging device 30 performs constant power charging (CP) instead of constant current charging (CC), it is possible to calculate the maximum total charge current value Iall by dividing the charging power by the charging voltage. If the maximum total charge current value Iall is acquired, the processing proceeds to step S206.

Step S206: Based on the current rate Irate and the maximum total charge current value Iall, the maximum charge current value Icharge which is assumed to flow after the start of charging is calculated. The maximum charge current value Icharge can be calculated using the following equation [2]. If the maximum charge current value Icharge is calculated, the processing proceeds to step S207.

$$Icharge=Iall*Irate \qquad [2]$$

Step S207: Based on the maximum charge current value Icharge, the internal resistance value Rself of the target battery 1-1, and the voltage value Vnow of the battery 1-1 at the present time, the maximum voltage value Vcharge which is assumed to rise in a predetermined time after the start of charging is calculated. The maximum voltage value Vcharge can be calculated using the following equation [3]. The predetermined time is set such that the processing is not ended immediately after starting charging. For example, the predetermined time can be set to be about several milliseconds. If the maximum voltage value Vcharge is calculated, the processing proceeds to step S208.

$$Vcharge=Vnow+Icharge*Rself \qquad [3]$$

Step S208: The difference voltage value $\Delta V$ between the maximum voltage value Vcharge and a predetermined full charge voltage value Vmax of the batteries 1-1 to 1-$n$ is calculated using the following equation [4]. The predetermined full charge voltage value Vmax can be determined based on overcharge voltage values of the batteries 1-1 to 1-$n$. If the difference voltage value $\Delta V$ is calculated, the processing proceeds to step S209.

$$\Delta V=Vmax-Vcharge \qquad [4]$$

Step S209: Determination is made whether or not the difference voltage value $\Delta V$ exceeds a predetermined value Vref. The predetermined value Vref is a threshold for determining whether or not to permit charging of the target battery 1-1, and can be set based on performance that the power supply system 1 is expected to perform, or the like. That is, in step S208 and step S209 described above, determination can be made whether or not the difference voltage value $\Delta V$ between the maximum voltage value Vcharge and the predetermined full charge voltage value Vmax exceeds the predetermined value Vref.

If the difference voltage value $\Delta V$ exceeds the predetermined value Vref (Yes in S209), the processing proceeds to step S210. On the other hand, if the difference voltage value $\Delta V$ does not exceed the predetermined value Vref (No in S209), the processing proceeds to step S211.

Step S210: Charging information (charging permission) indicating that charging of the target battery 1-1 is permitted is transmitted to the charging device 30. For example, a signal with a predetermined charging permission flag set to "ON" can be transmitted. If the charging information is transmitted to the charging device 30, the processing returns to step S201.

Step S211: Charging information (charging non-permission) indicating that charging of the target battery 1-1 is not permitted is transmitted to the charging device 30. For example, a signal with a predetermined charging permission flag set to "OFF" can be transmitted. If the charging information is transmitted to the charging device 30, the processing returns to step S201.

As long as determination can be made whether or not charging of the batteries 1-1 to 1-$n$ is to be started from the charging device 30 through the charging information, the information may be used. Therefore, in addition to information regarding the charging permission/non-permission, for example, the current rate Irate, the maximum charge current value Icharge, the maximum voltage value Vcharge, the difference voltage value ΔV, or the like may be transmitted to the charging device 30 as the charging information.

Control of Charging Device

FIG. 3

Step S301: Determination is made whether or not the charging information has been received from all battery control devices 2-1 to 2-$n$. If the charging information has been received from all the battery control devices 2-1 to 2-$n$ (Yes in S301), the processing proceeds to step S302. On the other hand, if the charging information has not been received from all the battery control devices 2-1 to 2-$n$ (No in S301), the processing waits until all the charging information is received.

Step S302: Determination is made whether or not all the charging information received from the battery control devices 2-1 to 2-$n$ permits charging. If all the charging information permits charging (Yes in S302), the processing proceeds to step S303. On the other hand, if all the charging information does not permit charging (No in S302), the processing returns to step S301 and waits for reception of charging information indicating that charging is newly permitted.

Step S303: Charging of the batteries 1-1 to 1-$n$ is started. If the charging of the batteries 1-1 to 1-$n$ is started, the processing proceeds to step S304.

Step S304: Determination is made whether or not the charge voltage values of the batteries 1-1 to 1-$n$ have each reached the predetermined full charge voltage value Vmax. If the charge voltage values have each reached the predetermined full charge voltage value Vmax (Yes in S304), the processing proceeds to step S305. If the charge voltage values each have not reached the predetermined full charge voltage value Vmax (No in S304), charging is continued until the charge voltage values each reach the predetermined full charge voltage value Vmax.

Step S305: The charging of the batteries 1-1 to 1-$n$ is ended. If the charging of the batteries 1-1 to 1-$n$ is ended, the processing returns to step S301.

Operation and Effect of Present Embodiment

In the power supply system 1 according to the embodiment of the present disclosure described above, the batteries 1-1 to 1-$n$ are respectively provided with battery control devices 2-1 to 2-$n$ for controlling the charging state, and the battery control devices 2-1 to 2-$n$ transmit and receive information about the internal resistance values R1 to Rn of the respective batteries 1-1 to 1-$n$ to and from each other. For example, the battery control device 2-1 transmits, to the charging device 30, the charging information of the target battery 1-1 generated based on the internal resistance values of the other batteries 1-2 to 1-$n$ received from the other battery control devices 2-2 to 2-$n$ and the maximum total charge current value Iall transmitted from the charging device 30 during charging. On the other hand, the charging device 30 appropriately executes charging processing of the batteries 1-1 to 1-$n$ based on the plurality of pieces of charging information received from the battery control devices 2-1 to 2-$n$.

With the above-described control, the charging device 30 can receive the charging state of the batteries 1-1 to 1-$n$, and thus even after the start of the charging, it is possible to grasp the individual situation of a specific battery, such as immediate completion of charging of the battery. Therefore, the charging device 30 can determine the timing of the start of charging, and thus it is possible to further suppress frequent repetition of the charging of the batteries 1-1 to 1-$n$. As a result, it is possible to further avoid a shortened lifetime and an immediate failure of a charging relay.

In the power supply system 1 according to the present embodiment, each of the battery control devices 2-1 to 2-$n$ determines whether or not to permit charging of the target battery, and transmits the result of the determination as charging information to the charging device 30.

With the above-described control, the charging device 30 can easily determine whether or not to start charging of the batteries 1-1 to 1-$n$ based on the charging information transmitted from the battery control devices 2-1 to 2-$n$.

In the power supply system 1 according to the present embodiment, each of the battery control devices 2-1 to 2-$n$ transmits and receives internal resistance values R1 to Rn obtained from the target battery to and from other battery control devices. Based on the internal resistance values R1 to Rn of the batteries 1-1 to 1-$n$ and the maximum total charge current value Iall, the battery control devices 2-1 to 2-$n$ calculate the maximum voltage value Vcharge of the target battery that rises in the predetermined time after the start of charging. When the difference voltage value ΔV between the maximum voltage value Vcharge and the predetermined full charge voltage value Vmax exceeds the predetermined value Vref, the battery control devices 2-1 to 2-$n$ transmit the charging permission of the target battery to the charging device 30.

With the above-described control, only when each of battery control devices 2-1 to 2-$n$ can determine that charging of the target battery will not be immediately completed within the predetermined time based on all the internal resistance values R1 to Rn and the maximum total charge current value during charging, charging permission can be transmitted to the charging device 30. Therefore, when the charging device 30 executes the charging processing of the batteries 1-1 to 1-$n$ based on the charging permission, it is possible to further suppress frequent repetition of the charging of the batteries 1-1 to 1-$n$. As a result, it is possible to further avoid the shortened lifetime and the immediate failure of the charging relay.

In the power supply system 1 according to the present embodiment, the charging device 30 is configured to start charging the batteries 1-1 to 1-$n$ when the charging permission is transmitted from all the battery control devices 2-1 to 2-$n$. As described above, the charging device 30 can easily grasp the timing of starting charging the batteries 1-1 to 1-$n$ simply by determining that the charging permission has been received from all the battery control devices 2-1 to 2-$n$.

One embodiment of the present disclosure can be used for a power supply system in which a battery pack in which a plurality of batteries is connected in parallel is used, or the like.

What is claimed is:

1. A power supply system comprising:
a plurality of batteries connected in parallel;
a plurality of battery control devices each of which is provided one to one for the batteries and is configured to
set any one of the batteries to be a target battery and control a charging state of the target battery,
transmit and receive an internal resistance value obtained from the target battery to and from other battery control devices, transmit a maximum internal resistance value to at least one of the other battery control devices and use a minimum internal resistance value to calculate current for the target battery, calculate a maximum voltage value of the target battery that rises in a predetermined time after a start of charging based on the internal resistance values of the batteries and a maximum total charge current value, and generate and transmit a charging permission of the target battery when a difference voltage value between the maximum voltage value and a predetermined full charge voltage value exceeds a predetermined value; and a charging device configured to transmit the maximum total charge current value to each of the battery control devices during charging, receive the charging permissions of the batteries transmitted from the battery control devices, and execute charging processing of the batteries based on the charging permissions of the batteries.

2. The power supply system according to claim 1, wherein the charging device is configured to start charging the batteries when the charging permissions are transmitted from all the battery control devices.

* * * * *